United States Patent
Ibok

(10) Patent No.: US 6,593,637 B1
(45) Date of Patent: Jul. 15, 2003

(54) METHOD FOR ESTABLISHING COMPONENT ISOLATION REGIONS IN SOI SEMICONDUCTOR DEVICE

(75) Inventor: Effiong Ibok, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 221 days.

(21) Appl. No.: 09/809,754

(22) Filed: Mar. 13, 2001

Related U.S. Application Data

(62) Division of application No. 09/479,493, filed on Jan. 7, 2000.
(60) Provisional application No. 60/169,695, filed on Dec. 7, 1999.

(51) Int. Cl.⁷ .............................................. H01L 29/00
(52) U.S. Cl. .................. 257/499; 257/501; 257/506; 257/510; 257/639; 257/349
(58) Field of Search ............................. 257/499, 506, 257/501, 510, 639, 640, 647, 649, 347, 349

(56) References Cited

U.S. PATENT DOCUMENTS

| | | | | |
|---|---|---|---|---|
| 4,922,318 A | * | 5/1990 | Thomas et al. | 357/43 |
| 6,204,532 B1 | * | 3/2001 | Gambino et al. | 257/329 |
| 6,399,989 B1 | * | 6/2002 | Dockerty et al. | 257/347 |

FOREIGN PATENT DOCUMENTS

JP          11-284146 A    * 10/1999

* cited by examiner

*Primary Examiner*—Nathan J. Flynn
*Assistant Examiner*—Remmon R. Fordé
(74) *Attorney, Agent, or Firm*—LaRiviere, Grubman & Payne, LLP

(57) ABSTRACT

A method for making an SOI semiconductor device including a silicon substrate includes implanting oxide and Nitrogen into the substrate and then annealing to drive Oxygen and Nitrogen through and below the buried oxide layer. The implanted species interact with the Silicon matrix of the substrate to establish field isolation areas that extend deeper than the buried oxide layer of the SOI device, to ensure adequate component isolation.

10 Claims, 2 Drawing Sheets

METHOD FOR ESTABLISHING COMPONENT ISOLATION REGIONS IN SOI SEMICONDUCTOR DEVICE

This is a divisional patent application of application Ser. No. 09/479,493, filed Jan. 7, 2000. This application claims the benefit of U.S. Provisional Application for patent application Ser. No. 60/169,695, filed on Dec. 7, 1999 and entitled METHOD FOR ESTABLISHING COMPONENT ISOLATION REGIONS IN SOI SEMICONDUCTOR DEVICE.

TECHNICAL FIELD

The present invention relates to the fabrication of-semiconductor devices, and more particularly to isolating components in SOI devices.

BACKGROUND OF THE INVENTION

Semiconductor chips are used in many applications, including as integrated circuits and as flash memory for hand held computing devices, wireless telephones, and digital cameras. Regardless of the application, it is desirable that a semiconductor chip hold as many circuits or memory cells as possible per unit area. In this way, the size, weight, and energy consumption of devices that use semiconductor chips advantageously is minimized, while nevertheless improving the memory capacity and computing power of the devices. Moreover, it is desirable that the devices operate at very fast speeds.

Among the things that can limit the speed with which semiconductor devices operate is extraneous capacitances in the devices. More specifically, undesired electrical capacitance can arise from the portions of the source and drain regions that overlap the gate region, as well as from the source and drain junctions. To limit junction depth and, hence, to decrease junction capacitance, so-called "silicon on insulator", or "SOI", technology, can be used in which a layer of oxide is buried in the silicon substrate to act as a stop to dopant diffusion (and, hence, to act as a stop to source/drain junction depth).

To isolate adjacent components on a semiconductor device, isolation regions are formed in the substrate between the components. In the context of SOI devices, the isolation regions are formed prior to source/drain dopant implantation by forming trenches down to the buried oxide layer and then filling the trenches with dielectric. As understood by the present invention, however, because the depth at which buried oxide layers are typically formed in a substrate can be as close as 1000 Å to the surface of the substrate to limit junction capacitance, at such a depth the isolation trenches can be insufficiently deep to adequately isolate adjacent device components from each other. With the above shortcomings in mind, the present invention makes the critical observation that it is possible to limit the depth of the source/drain junctions in semiconductor devices (and, hence, decrease the junction capacitances) using shallow buried oxide layers, while nevertheless forming isolation regions between adjacent components that are sufficiently deep to adequately isolate the components from each other.

BRIEF SUMMARY OF THE INVENTION

A method for making an SOI semiconductor device includes implanting Oxygen and/or Nitrogen into the substrate in intended isolation regions. The method also includes heating the substrate to cause the Oxygen and/or Nitrogen to diffuse and interact with the substrate to establish isolation regions, such that the isolation regions extend from the surface of the substrate to below the buried oxide layer of the SOI device. After forming the isolation regions, source and drain regions can be conventionally formed.

In a preferred embodiment, the heating act includes annealing the substrate. In this embodiment, to promote a uniform Oxygen concentration in the isolation regions, the Oxygen can be implanted using an implantation energy that increases over time. The substrate can also be annealed in an oxygenated ambient atmosphere to replenish the Oxygen concentration near the surface of the substrate as the Oxygen diffuses into the substrate, to promote a uniform Oxygen concentration in the isolation regions. In still another embodiment, instead of annealing the substrate after Oxygen implantation, the substrate can be oxidized to promote a uniform Oxygen concentration in the isolation regions.

In another aspect, an SOI semiconductor device includes a substrate and plural component isolation regions formed in the substrate. The isolation regions include Silicon and at least one of: Oxygen, and Nitrogen.

In still another aspect, a method for making an SOI semiconductor includes providing a semiconductor substrate that defines a surface and that has a buried oxide layer, and then establishing component isolation regions in the substrate which extend from the surface to below the buried oxide layer.

Other features of the present invention are disclosed or apparent in the section entitled DETAILED DESCRIPTION OF THE INVENTION.

BRIEF DESCRIPTION OF DRAWINGS

For understanding of the present invention, reference is made to the accompanying drawing in the following DETAILED DESCRIPTION OF THE INVENTION. In the drawings.

DETAILED DESCRIPTION OF THE INVENTION

The principles of the present invention are equally applicable to a wide range of semiconductor and integrated circuit design and manufacture regimens, including but not necessarily limited to the production of non-volatile memory devices. All such implementations are specifically contemplated by the principles of the present intention.

Figure 1:
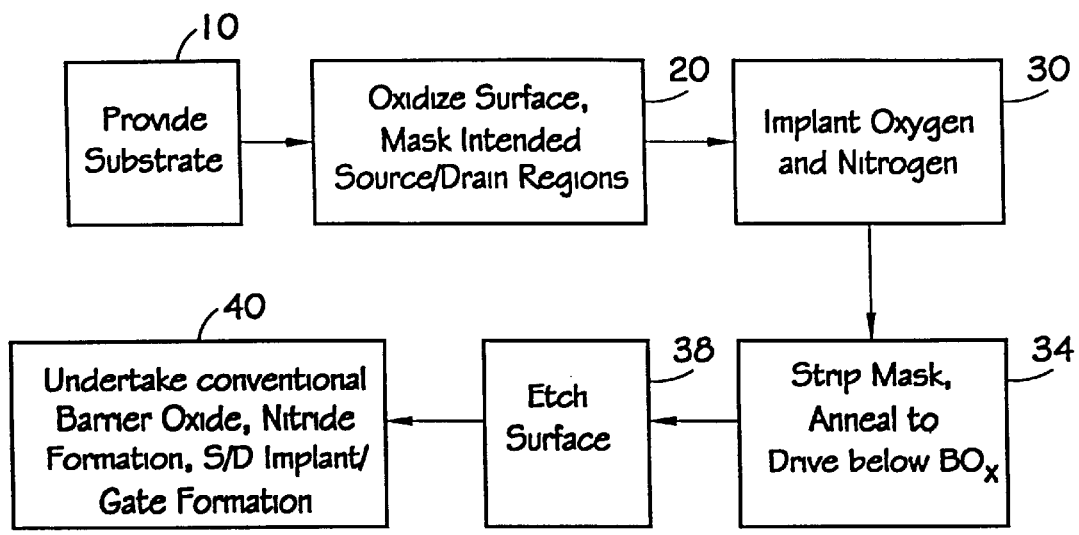
FIG. 1 is a flow chart of the present process.
Figure 2:
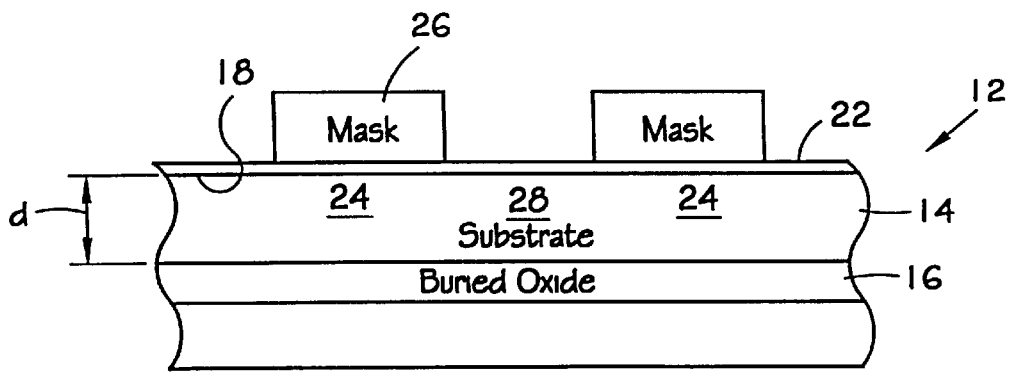
FIG. 2 is a side view of a portion of a semiconductor device made in accordance with the present in invention, after masking and before isolation species implantation.

Referring initially to FIGS. 1 and 2, at block 10 in FIG. 1 a semiconductor device 12 (FIG. 2) is provided which includes a silicon substrate 14. In one preferred embodiment, the device 10 is an SOI device. Accordingly, a buried oxide layer 16 is disposed in the substrate 14 at a depth "d" from the surface 18 of the substrate 14 of about one thousand Angstroms (1000 Å).

Proceeding to block 20 of FIG. 1 and still referring to FIG. 2, the surface 18 is oxidized such that a surface oxidation layer 22 is formed thereon. Also, intended source/drain regions 24 of the substrate 14 are masked with, e.g., photoresist layers 26 in accordance with masking principles known in the art. Intended isolation regions 28 of the substrate 14, however, are not masked.

Figure 3:
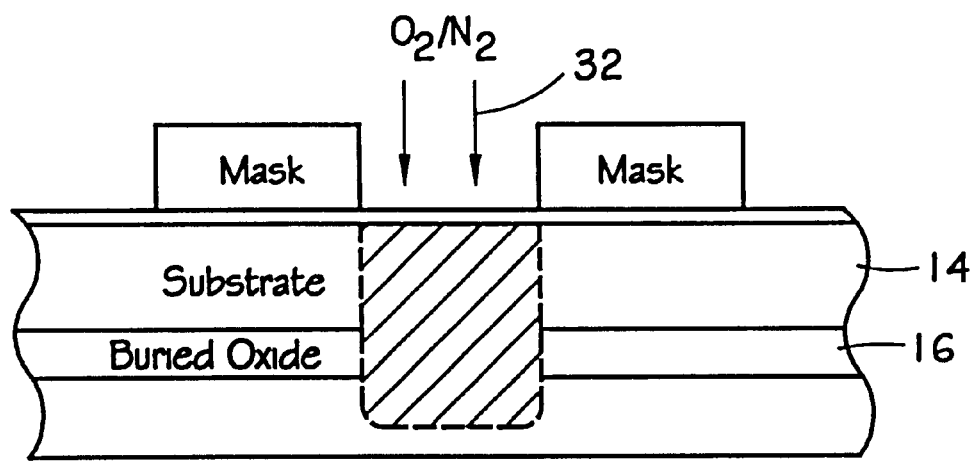
FIG. 3 is a side view of a portion of a semiconductor device made in accordance with the present invention after implantation of the isolation species.

Proceeding to block 30 of FIG. 1 and now referring to FIG. 3, Nitrogen and/or Oxygen are implanted into the intended isolation regions 28, as indicated by the arrows 32. Preferably, both Nitrogen and Oxygen are implanted at block 30.

Figure 4:
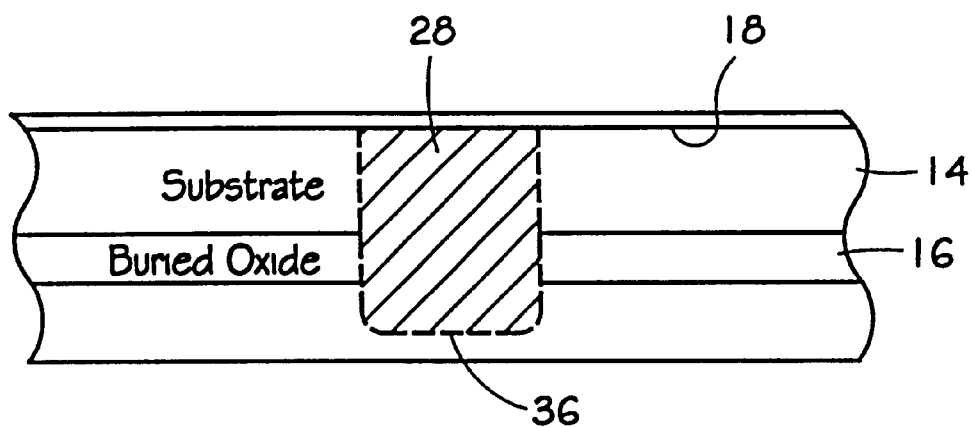
FIG. 4 is a side view of a portion of a semiconductor device made in accordance with the present invention, after stripping away the mask and annealing.

Moving to block 34 of FIG. 1 and referring to FIG. 4, the mask layers 26 are stripped away and the substrate 14 is annealed, to drive the implanted species below the buried oxide layer 16. In other words, a bottom boundary 36 of each isolation region 28 is spaced further from the surface 18 of the substrate 14 than is the buried oxide layer 16, i.e., the isolation regions 28 extend from the surface 18 of the substrate 14 to a depth that is deeper in the substrate 14 than the buried oxide layer 16. As intended by the present invention, the Oxygen and/or Nitrogen diff-use and interact with the Silicon matrix of the substrate 14 to establish the isolation regions 28 during the annealing step.

In one preferred embodiment, to promote a uniform Oxygen and/or Nitrogen concentration in the isolation regions 28, the implanted species, and in particular the Oxygen, is implanted using an implantation energy that increases over time. In other words, the implantation energy is varied as appropriate to establish a uniform Oxygen concentration profile from the surface 18 of the substrate 14 to the bottom boundaries 36 of the isolation regions 28. Or, the substrate 14 can be annealed in an oxygenated ambient atmosphere, such that the concentration of Oxygen near the surface 18 of the substrate 14, which otherwise could be depleted of Oxygen as the Oxygen diff-uses deeper into the substrate 14 during annealing, is fortified, thereby promoting a uniform Oxygen concentration profile. Or yet again, the annealing step at block 34 can be replaced by simply oxidizing the substrate 14 to promote a uniform Oxygen concentration in the isolation regions.

Once the isolation regions 28 have been formed, the process moves to block 38, wherein the surface oxidation layer 22 is etched away by means known in the art. Manufacturing is conventionally completed at block 40, wherein appropriate barrier oxides and nitrides are formed, source and drain dopants are implanted into the substrate 14, gate stacks are formed on the surface 18 of the substrate 14, and contacts and interconnects are formed.

The present invention has been particularly shown and described with respect to certain preferred embodiments of features thereof However, it should be readily apparent to those of ordinary skill in the art that various changes and modifications in form and detail may be made without departing from the spirit and scope of the invention as set forth in the appended claims. In particular, the use of: alternate layer deposition or forming methodologies; etching technologies; masking methods; lithographic methods, passivation and nitridization techniques; as well as alternative semiconductor designs, as well as the application of the technology disclosed herein to alternate electronic components are all contemplated by the principles of the present invention. The invention disclosed herein may be practiced without any element which is not specifically disclosed herein. The use of the singular in the claims does not mean "only one", but rather "one or more", unless otherwise stated in the claims.

What is claimed is:

1. An SOI semiconductor device including a substrate defining a surface and having a buried oxide layer spaced from the surface and plural component isolation regions extending vertically from the surface to below the buried oxide layer formed in the substrate, the isolation regions including Silicon and at least one of Oxygen, and Nitrogen.

2. The device of claim 1, wherein the isolation regions include Silicon, Oxygen, and Nitrogen.

3. The SOI device of claim 2, wherein the substrate defines a surface and the device includes a buried oxide layer, and the isolation regions are formed by implantation of oxygen into the substrate and extend from the surface to below the buried oxide layer.

4. The device of claim 1 wherein the Oxygen and/or Nitrogen have/has a uniform concentration.

5. An SOI semiconductor device including a substrate defining a surface and having a buried oxide layer spaced from the surface and plural component isolation regions extending vertically from the surface to below the buried oxide layer, the isolation regions formed in situ in the substrate, the isolation regions including Silicon and at least one of: Oxygen, and Nitrogen.

6. The device of claim 5 wherein the isolation regions include Silicon, Oxygen and Nitrogen.

7. The device of claim 5 wherein the Oxygen and/or Nitrogen have/has a uniform concentration.

8. An SOI semiconductor device including a substrate defining a surface and having a buried oxide layer spaced from the surface and at least one component isolation region extending from the surface to below the buried oxide layer formed in the substrate, the isolation region including Silicon and at least one of Oxygen, and Nitrogen.

9. The device of claim 8 wherein the isolation regions include Silicon, Oxygen and Nitrogen.

10. The device of claim 8 wherein the Oxygen and/or Nitrogen have/has a uniform concentration.

* * * * *